(12) United States Patent
Ganter

(10) Patent No.: US 7,262,599 B2
(45) Date of Patent: Aug. 28, 2007

(54) METHOD AND CONTROL DEVICE FOR OBTAINING MAGNETIC RESONANCE DATA FOR IMAGING

(76) Inventor: Carl Ganter, Attenhauserstrasse 14, 82057 Icking (DE)

( * ) Notice: Subject to any disclaimer, the term of this patent is extended or adjusted under 35 U.S.C. 154(b) by 0 days.

(21) Appl. No.: 11/451,605

(22) Filed: Jun. 13, 2006

(65) Prior Publication Data

US 2007/0080687 A1 Apr. 12, 2007

(30) Foreign Application Priority Data

Jun. 14, 2005 (DE) .................. 10 2005 027 483

(51) Int. Cl.
*G01V 3/00* (2006.01)
(52) U.S. Cl. ..................... 324/309; 324/318
(58) Field of Classification Search ........ 324/300–322; 600/410–445
See application file for complete search history.

(56) References Cited

U.S. PATENT DOCUMENTS

| | | | |
|---|---|---|---|
| 5,408,180 A * | 4/1995 | Mistretta et al. | ............ 324/306 |
| 5,602,477 A * | 2/1997 | McCarthy et al. | .......... 324/315 |
| 6,912,415 B2 * | 6/2005 | Kruger et al. | .............. 600/410 |
| 2005/0270026 A1 * | 12/2005 | Guthausen et al. | ......... 324/307 |
| 2007/0035299 A1 * | 2/2007 | Deimling | .................... 324/309 |

OTHER PUBLICATIONS

Ganter, Steady State of Gradient Echo Sequences with Radiofrequency Phase Cycling: Analytical Solution, Contrast Enhancement with Partial Spoiling, 2006, Magnetic Resonance in Medicine 55:98-107, pp. 98-107.
Denolin et al, On the Calculation and Interpretation of Signal Intensity in Echo-Shifted Sequences, 2004, Magnetic Resonance in Medicine 41:123, pp. 123-134.
Nitz, "Magnetresonanztomographie", Siemens AG etc., 2003, pp. 745-766.

Zur et al, Spoiling of Transverse Magentization in Steady-State Sequences, 1991, Magnetic Resonance in Medicine 21, pp. 251-263.

* cited by examiner

Primary Examiner—Brij B. Shrivastav
(74) Attorney, Agent, or Firm—Dennison, Schultz & MacDonald

(57) ABSTRACT

The invention relates to the obtainment of magnetic resonance measurement data for the reproduction of an image of an object volume, illustrating the contrast between volume elements (voxels) which differ from one another in the parameter vectors $P_i$ of the magnetic resonance property of the respective inherent substance i. The object volume which is to be imaged is subjected within a stationary magnetic field to a sequence of repetitive blocks of effects, each containing an RF-pulse with a flip angle $\alpha < 90°$ and magnetic field gradients, in order to obtain in each block $N \geq 1$ location-coded measurement signals and to achieve sufficient intravoxel dephasing, wherein the phase $\phi(k)$ of the RF-pulse is changed from block to block in accordance with the rule $$\phi_k - \phi_{k-1} = \phi + k^*\Phi,$$

where k is the running index of the blocks within the sequence and $\phi$ is a randomly selected phase angle. In accordance with the invention, for the sequence parameter $\Phi$ a value $\Phi_c$ is selected, in which the set $\{S_{ij}\}$ of the difference values $$S_{ij} = \sum_{n=1}^{N} [S_n(\Phi, Q, P_i) - S_n(\Phi, Q, P_j)]$$

is optimized in accordance with a selected criterion K ($\{S_{ij}\}$), where n with $1 \leq n \leq N$ is the running index of the measurement signals detected within a respective block, $S_n(\Phi,Q,P_i)$ or $S_n(\Phi,Q,P_j)$ is the value of the transversal magnetization of the voxels, which contain the substance i or j, in the condition of dynamic equilibrium at the point in time of the maximum of the nth measurement signal, Q stands for the values of the remaining sequence parameters, and $\{S_{ij}\}$ includes all desired pairs of substances i and j.

11 Claims, 5 Drawing Sheets

METHOD AND CONTROL DEVICE FOR OBTAINING MAGNETIC RESONANCE DATA FOR IMAGING

FIELD OF THE INVENTION

The present invention relates to the locally resolved examination of objects by means of magnetic resonance (MR) and relates specifically to a method of obtaining magnetic resonance measurement data for the reproduction of an image of an object volume, illustrating the contrast between volume regions which differ from one another in selected magnetic resonance properties. The invention also relates to a control device for carrying out the method in a magnetic resonance device.

In reference to and acknowledgement of the prior art, the following corresponding references in the generally available literature will be cited in the description hereinunder:

[1] Y. Zur et al., "Spoiling of Transverse Magnetization in Steady-State Sequences", Magn. Reson. Med. 21 (1991), pp 251-263.

[2] W. R. Nitz, "Magnetresonanztomographie, Sequenzakronyme eund weitere Kürzel in der MR-Bildgebung", Radiologe 43 (2003), pp 745-765.

[3] W. Denolin, T. Metens, "On the Calculation and Interpretation of Signal Intensity in Echo-Shifted Sequences", Mag. Reson. Med. 51 (2004), pp 123-134.

These references are identified in the description text by the above reference numbers in square brackets [ ].

DESCRIPTION OF RELATED ART

In the case of the conventional MR-imaging methods, the object which is to be examined is disposed in a homogeneous, stationary magnetic field $B_0$ which is also defined as the "main field" and whose direction is defined as the z-direction. The spins of the atomic nuclei used in imaging (generally these are the hydrogen protons) comprise a "longitudinal" component in parallel with the main field, and a "transversal" component which is perpendicular to said longitudinal component. The transversal component precesses about the z-axis at the Larmor frequency $f=\gamma*B$, where $\gamma$ is the gyromagnetic ratio dependent upon the type of spin and B is the local magnetic field strength (the symbol * stands for multiplication in this case and hereinunder). The basis for establishing the x- and y-axis in the following description will be the typical convention of a coordinate system which rotates at the Larmor frequency $f_0=\gamma*B_0$ about the z-axis. Therefore, spins which are subjected precisely to the field strength $B_0$ appear stationary in this reference system.

At equilibrium, the interaction with $B_0$ causes an energetically preferred net alignment of the spins in parallel with $B_0$. This corresponds to a net magnetization with a value $M_0$ in the z-direction. By the excitation of interesting spins by means of suitable radio frequency pulses or RF-pulses, of which the frequency must match the Larmor frequency of the spins which are to be excited, this net magnetization can be tilted about any "flip angles" $\alpha$ about an axis which extends orthogonally with respect to $B_0$ in the xy-plane. In this case, the equilibrium magnetization $M_0$ produces a transversal component $M_{xy}=M_0*\sin(\alpha)$ and a longitudinal component $M_z=M_0*\cos(\alpha)$. The likewise freely selectable tilting direction, i.e. the angle orientation of the tilt axis within the xy-plane is defined as the "phase" of the RF-pulse. Like the individual spins, the transversal component $M_{xy}$ of the net magnetization as generated by the tilting action also precesses at the Larmor frequency which can be detected as a measurement signal by means of suitable high frequency coils or antennas.

Reciprocal disturbances caused by adjacent spins effect a dephasing of the transversal magnetization $M_{xy}$ and as a consequence produces a temporally exponential decrease in the measurement signal (T2-relaxation). The associated time constant is defined as the "spin-spin-relaxation time" T2. Depending upon the type of measurement carried out, field inhomogeneities can further accelerate the time decrease in the measurement signal, which is then described by an effective time constant T2*<T2.

At the same time as the decrease in the transversal magnetization $M_{xy}$, the longitudinal equilibrium magnetization (T1-relaxation) recovers. The time constant of this exponential process is defined as the "spin-grid relaxation time" T1, where T1>T2 always applies.

In order to achieve the excitation of selective layers (2D-imaging) or layer blocks (3D-imaging) as required for imaging purposes, and also for the purposes of actual location-coding during signal detection, defined magnetic field gradients are temporarily impressed upon the $B_0$-field in selected spatial directions. This renders it possible to change the Larmor frequency linearly along a freely selectable spatial direction.

A "layer selection gradient" which is active during an RF-pulse thus limits the efficacy of the excitation to the particular layer which is perpendicular to the gradient direction, in which the local Larmor frequency falls within the frequency range of the RF-pulse.

If during the subsequent signal detection a "readout gradient" in parallel with the excited layer is activated, then the Larmor frequency of the excited spins varies in this direction. By means of a subsequent frequency analysis (Fourier transformation) of the signal detected in this manner, it is possible to calculate the associated location information in the stated direction.

In accordance with the same fundamental principle, location-coding is performed perpendicular to the readout direction by means of so-called "phase coding gradients" which are activated in the time interval between the RF-pulse and signal detection, wherein this procedure is repeated so frequently at a suitably varied gradient strength until sufficient information has been collected for recalculating the location information in this direction also. In the case of 3D-imaging, this method is additionally used also in the direction of the layer selection gradient.

The signal detection is performed within one or several suitably selected time windows ("readout interval") after the RF excitation pulse. Typically, a so-called "echo" of the transversal magnetization which relaxes after the RF excitation is used as the measurement signal which is to be detected. It is known that echoes of this type can be generated either by in each case a refocusing 180° RF-pulse between excitation and readout interval ("spin echo") or by the inversion of the direction of a readout gradient ("gradient echo") which commences before the readout interval. The time function of an echo signal of this type has an envelope curve with a maximum at a point in time when the readout gradient is balanced and no phase coding gradients are effective, i.e. in the middle of the k-space for the Fourier transformation.

By the repetitive usage of elementary measuring "blocks" in each case consisting of at least one RF-pulse, location coding gradients and at least one readout interval, a data record is ultimately obtained which can be used to calculate an image representation which is composed of small volume elements, so-called "voxels", the size of which determines the resolution.

The entire series of blocks which are implemented for an image representation are defined in this case as a "sequence". In accordance with convention, the duration between two excitation pulses is defined as the "repetition time" TR. The time interval between the RF excitation pulse and the signal detection (more specifically the middle of the readout interval where typically the maximum of the measurement signal appears) is called the "echo time" TE.

If the gradient activity integrated over a block duration is sufficiently different from zero, this artificially created field inhomogeneity causes a complete dephasing of the spins within each individual voxel. In such a case, this is referred to as "sufficient intravoxel dephasing" and the gradient effect leading to this is defined as the "crusher gradient".

The properties of an object which can be analyzed by means of magnetic resonance and are defined in this instance as "object parameters" include not only the spin density SD, i.e. the density of the spins which can be influenced by the RF-pulses, but also the various relaxation time constants of the spin magnetization, the spin-grid relaxation time T1 and the spin-spin relaxation time T2. By the specific selection of the sequence parameters, i.e. the type of MR sequence, the flip angle and the amplitude and time relations of RF and gradient pulses within the blocks of the sequence, it is possible to ensure that the strength of the generated MR signals or echoes depends to a particular extent upon in each case determined, selected parameters (T1, T2, SD, . . . ) of the object. This type of "weighting" serves to generate an image, in which volume elements which differ from one another in the relevant object parameters contrast one another to a considerable extent.

A general difficulty of MR-imaging resides in the fact that a compromise must be reached in relation to the time-spatial resolution and the image quality, typically expressed by the "signal-to-noise ratio" S/N. In essence, the following correlation applies irrespective of the type sequence:

$$S/N \propto \not{c} T^*V.$$ Equation 1

In this case, V stands for the voxel volume which is to be illustrated and T stands for the total time during which a measurement signal was recorded in the sequence of this voxel.

The ability to mutually delimit volume regions which differ from one another in object parameters, is more likely to be determined by the "contrast-to-noise ratio" C/N which is produced substantially as the difference in the S/N quotients of the respective volume regions.

Particularly when measuring times are greatly limited, rapid sequences are required with intrinsically high signals and contrasts, in order to permit good resolutions. In contrast to the family of spin echo sequences and the variants derived therefrom, it is possible with gradient echo sequences to achieve particularly short intervals between excitation pulses which is why they are used primarily in rapid imaging. The abbreviation FFE ("Fast Field Echo") will be used hereinunder to refer to the category of rapid gradient echo sequences.

A common feature of practically all FFE-sequences is that they are made up of simple blocks of the constant time duration TR ("repetition time") which each contain precisely one RF-pulse with a constant flip angle α. The known FFE-sequences differ as to whether a crusher gradient is used or not and as to whether and how the phases $\phi_k$ of the RF-pulses vary from excitation to excitation according to the general rule $$\phi_k - \phi_{k-1} = \phi + k*\Phi$$ Equation 2 where k defines the running index (i.e. the current number of blocks within the sequence) and the values $\phi$ and $\Phi$ depend upon the type of sequence and are fixedly adjusted. In [1] it was demonstrated that for schemes which deviate from Equation 2 there is no equilibrium which is required for artifact-free images.

The following Table 1 provides an overview of the three main variants of the gradient echo sequences and their signal behavior, wherein the following text will deal predominantly with applications in which the repetition time TR is shorter than the natural relaxation times T1 and T2:

TABLE 1

| Sequence name (company-dependent) | B-FFE, TrueFISP, FIESTEA, . . . | N-FFE, FISP, GRASS, . . . | T1-FFE, FLASH, SPGR, . . . |
|---|---|---|---|
| $\phi$ | generally 180° | any | any |
| $\Phi$ | 0° | 0° | "large" (see below) |
| Crusher gradient | no | yes | yes |
| Weighting | T2/T1 | T2/T1 | T1 |
| Signal strength | high | less high | low |

In the case of shorter TR and particularly for TR<T2, residual transversal magnetization of earlier excitation pulses is still present at the point in time of excitation. Since each excitation serves to mix these portions, the signal behavior generally depends in a complicated manner upon T1 and T2.

Without intravoxel dephasing, i.e. without crusher gradients, the value $\Phi$ must be set to zero in order to obviate artifacts [1]. These sequences (B-FFE, described as "True-FISP" in [2]) show in particular for TR<T1,T2 and larger flip angles α (ca. 60°-70°) a pronounced T2/T1 contrast. Since transversal components of the magnetization are not lost but are reused these sequences provide a strong signal which also does not decrease for very small TR. Field inhomogeneities can have a detrimental effect and become apparent in unfavorable conditions as signal cancellations ("banding-artifacts").

In order to obviate the banding-artifacts, crusher gradients are used which does however come at the cost of a somewhat reduced signal strength. For short TR and large α, a T2/T1 mixing contrast is also produced in this case, if the value $\Phi$ is set to zero (N-FFE-sequence, described as FISP-sequence e.g. in [2]).

It is frequently desirable to achieve pure T1-weighting instead of the T2/T1 mixing contrast. For this purpose, residual transversal magnetization portions (which include the T2 dependency) must also be substantially eliminated for short TR before the RF-excitation. In order to achieve this, the value $\Phi$ must be selected in a suitable manner in order to suppress correlations of successive excitation phases in the most effective manner possible. This technique of pseudo-random variation of the excitation phases—always with crusher gradients—is defined as "RF-Spoiling" (T1-FFE-sequence). In [1] the ideal value for $\Phi$ was found to be a phase angle of about 117° which is also used in practice. Other typical values are e.g. 50° or 150°. In actual fact, there is a larger set of such ideal values for $\Phi$, wherein all of these values depend negligibly upon the other sequence parameters (such as e.g. flip angles, repetition time TR, echo time TE, coding gradients, etc.) and object parameters (such as e.g. T1, T2, spin density SD). Since in the case of a T1-FFE-sequence in the strived-for ideal scenario only longitudinal magnetization is activated by RF-pulses, the signal strength decreases significantly with TR.

In the publication "On the Calculation and Interpretation of Signal Intensity in Echo-Shifted Sequences" by Vincent Denolin and Thierry Metens, Magn. Res. Med. 2004, 51, 123-134, an analytical treatment of rapid gradient echo sequences is described, in which by means of suitable gradient switches the echo formation can be prolonged by several TR (repetition time). Only the case of φ=0 will be considered, i.e. no RF-spoiling.

U.S. Pat. No. 6,628,116 B1 relates to configuration of so-called preparation pulses (spectral and/or spatial saturation regions) which are located upstream of the actual measurement. This is achieved by unbalanced gradients and linearly rising phases of the preliminary pulse.

In their publication "Magnetization Preparation During the Steady State: Fat-Saturated 3D True FISP", Mag. Res. Med. 2001, 45, 1075-1080, Klaus Scheffler, Oliver Heid and Jurgen Hennig describe the incorporation of additional spectral excitation pulses into a conventional 3D-TrueFISP-sequence such that an effective fat saturation is achieved with otherwise substantially unchanged contrasts.

SUMMARY OF THE INVENTION

The present invention is based upon the consideration that there can be contrast criteria which cannot be fulfilled in an optimum manner by the known variants of rapid MR-imaging sequences. On the basis of this consideration, it is the object of the invention to provide an MR-imaging sequence which can be specifically adapted to selected parameters of the magnetic resonance property of the object volume which is to be imaged, in order to optimize the contrast between volume regions which differ from one another in these parameters. This object is achieved in accordance with the invention.

Accordingly, the invention is implemented in a method of obtaining magnetic resonance measurement data for the reproduction of an image of a volume of an object which is subjected to a constant main magnetic field $B_0$ in a longitudinal direction, illustrating the contrast between volume elements (voxels) of the image representation which differ from one another in the parameter vectors $P_i$ of the magnetic resonance property of the respectively inherent substance i. The object volume which is to be imaged is subjected to a sequence of repetitive blocks of effects, each containing an RF-pulse with a flip angle α<90°, in order to generate measurable transversal magnetization, and magnetic field gradients in order to obtain in each block N≧1 location-coded measurement signals of the transversal magnetization for the image reconstruction and to achieve sufficient intra-voxel dephasing of the transversal magnetization before the appearance of the next RF-pulse. The phase φ(k) of the RF-pulse is changed from block to block in accordance with the rule $$\phi_k - \phi_{k-1} = \phi + k*\Phi \qquad \text{Equation 2}$$

where k is the running index of the blocks within the sequence and φ is a randomly selected phase angle. The invention is characterized by the fact that for the sequence parameter Φ a value $\Phi_c$ is selected, in which the set $\{S_{ij}\}$ of the difference values $$S_{ij} = \sum_{n=1}^{N} [S_n(\Phi, Q, P_i) - S_n(\Phi, Q, P_j)] \qquad \text{Equation 3}$$

is optimized in accordance with a selected criterion K ($\{S_{ij}\}$), where n with 1≦n≦N is the running index of the measurement signals detected within a respective block, $S_n(\Phi,Q,P_i)$ or $S_n(\Phi,Q,P_j)$ is the value of the transversal magnetization of the voxels, which contain the substance i or j, in the condition of dynamic equilibrium at the point in time of the maximum of the nth measurement signal, Q stands for the values of the remaining sequence parameters, and $\{S_{ij}\}$ includes all desired pairs of substances i and j.

The terms such as "voxel" and "maximum of the measurement signal" as used above are to be interpreted here and below as corresponding to the generally typical conventions. This implicitly includes the understanding that by reason of the location coding the volume elements in the measurement signal are not identical to the voxels of the image representation but are associated therewith by the so-called "point spread function". According to convention, the basis for assessing the image contrast is provided by "ideal" voxels in which the respective substance is contained in pure form (partial volume effects which also occur in reality, i.e. substance mixtures in individual voxels, can remain excluded from the assessment, as they are of no relevance to the optimum adjustment of the sequence parameters). In normal language usage, the said maximum of the measurement signal relates to the middle of the k-space (i.e. as already stated above, the point in time when the readout gradient is balanced and no phase coding gradients are active). It is also associated with the general convention of considering the value of the transversal magnetization at this point in time to be the contrast-determining value.

The invention utilizes the rule previously applied for T1-FFE-sequences only insofar as the phase changes of the RF-pulse are performed according to the above general Equation 2. In the prior art, all efforts were put into adjusting the variable Φ as precisely as possible to one of the "ideal values", in which any remaining $M_{xy}$-residual magnetization portions are destroyed in the most effective manner possible, so that S(Φ,Q,P) corresponds substantially with an ideal value $S_{ideal}(Q,P)$ which provides a pure T1-weighting. In this lay previously the single motive of pseudo-random RF-phase shifting from block to block as per Equation 2. The present invention deviates from this established approach, in that the variable Φ is deliberately adjusted to a value other than one of the ideal values, and moreover targeted towards optimization of contrasts between in each case selected object properties, i.e. the optimization of difference values. This kind of "difference optimization" differs fundamentally from a "weighting" in the conventional sense. Accordingly, a Φ-measurement in accordance with the invention renders it possible to achieve different contrasts than those demonstrated as a consequence of a pure T1-weighting. The criterion K ($\{S_{ij}\}$) which relates to difference values between signal strengths, and thus the type of contrast can be selected arbitrarily depending upon which contrast is desired for the purpose of image representation.

In view of the described prior art, it is a surprising fact that a specific optimization of contrast can be achieved by non-adherence to the ideal value of Φ. In this case, the circumstance that the progression of the function S(Φ,Q,P) depends upon the object parameters is exploited to a substantial extent.

If in each block of the sequence only one measurement signal is detected (i.e. N=1), a value $Φ_c$ can be selected for Φ, wherein the set $\{(S_{ij})\}$ of the differences $$S_{ij}=S_1(Φ,Q,P_i)-S_1(Φ,Q,P_j) \qquad \text{Equation 4}$$

is optimized according to a desired criterion, wherein the set $\{S_{ij}\}$ also includes all desired pairs of substances i and j in this case. The value $Φ_c$ to be selected can be adjusted e.g. so that the difference between the function $S_1(Φ,Q,P_i)$ which applies to a first substance i and the function $S_1(Φ,Q,P_j)$ which applies to a second substance j has a maximum. As a consequence, an image representation is produced, in which volume regions, in which the substance i dominates contrast in optimum fashion with respect to volume regions, in which the substance j dominates. A maximum of the difference function can be found in a numerically simulated manner or analytically by calculation, or can be found empirically using phantom-objects containing the substances i and j.

Advantageous embodiments and developments of the invention are described herein. The method in accordance with the invention can be embodied in the control device of a magnetic resonance tomograph (MRT-scanner), e.g. as a computer program product, wherein the variable Φ is preferably installed as an adjustable parameter.

The concept of the invention and particular applications and embodiments are explained in detail hereinunder with reference to the drawings.

DETAILED DESCRIPTION OF THE INVENTION

Figure 1:
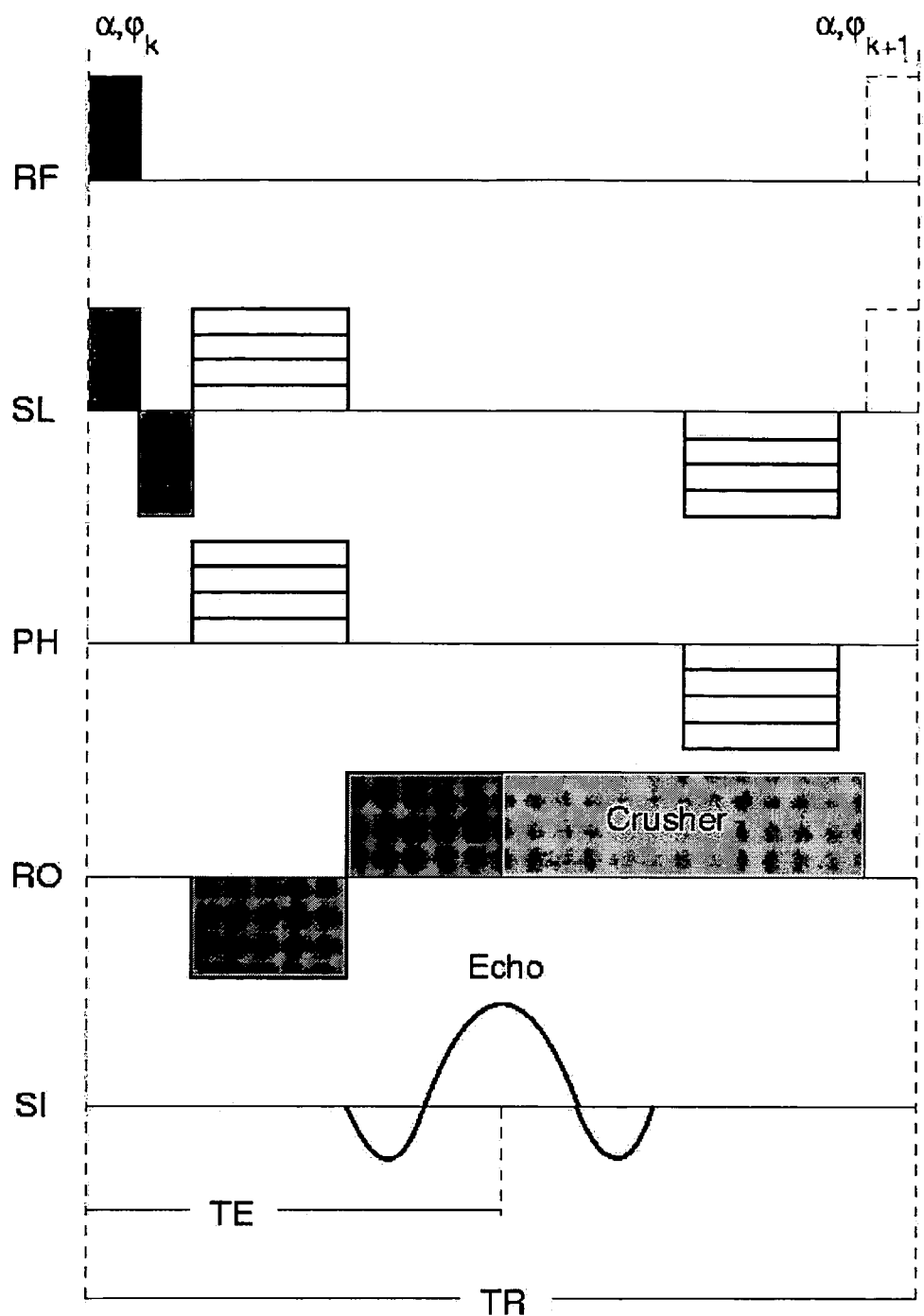
FIG. 1 shows the structure of a control sequence in accordance with the invention for MR-imaging.

FIG. 1 illustrates the timing in the kth block of a typical MR-imaging sequence in terms of the invention which—apart from the value for Φ— corresponds to a 3D-variant of a T1-FFE-sequence. The individual lines show in simplified form from the top downwards the RF-pulse, the gradients in the layer selection direction SL, phase coding direction PH and readout direction RO, and an echo SI as a measurement signal. Therefore, in the case shown, the number N of measurement signals per block is equal to 1 and the measurement signal is a gradient echo produced by the inversion of the gradient applied in the readout direction RO. In the 3D-variant illustrated, the phase coding gradient in the layer selection direction and the phase coding direction is changed from block to block in its amplitude (which is symbolized in the usual manner by the level stages indicated) and is repeated in the inverse direction in each case after the echo detection, in order to make the integral of this gradient, which is summated over the block, equal to zero as is typical and known per se.

If the crusher gradients come after the echo-readout interval as in the illustrated case, then the transversal magnetization $S^+$, which is produced in the dynamic equilibrium in each case directly after the RF-excitation, is the "basic variable" for the signal strength S. If the crusher gradients come before the readout interval, then the basic variable is the transversal magnetization $S^-$ directly before the RF-excitation. The signal strength S of the read-out echo, as expressed by the value of the transversal magnetization at the point in time of the maximum of the echo is a certain amount smaller than the aforementioned basic variable by reason of the relaxation phenomena which become apparent in the time interval TE (echo time) between excitation and echo detection. This measurement is substance-specific and depends naturally also upon the echo time TE. In the case of rapid sequences, the echo time TE can be assumed to be short as a result of TR<T1,T2, so that the substance-specific decrease in the transversal magnetization over the echo time TE is small. Therefore, the differences in this decrease which occur between various substances are also so small that they can virtually be disregarded. It can also be assumed that the signal strength is substantially proportional to the above-mentioned basic variable, i.e. is proportional to the transversal magnetization $S^+$ (or $S^-$) directly after (or before) the RF-pulse.

Important factors for the signal strength S from a substance i are thus the set of object parameters $T1_i$, $T2_i$, $SD_i$, ..., which is to be regarded as a "vector" $P_i$, also the adjusted value $Φ_c$ for the RF-phase control parameter Φ and, as further sequence parameters, the flip angle α, the repetition time TR, and the strength of the crusher gradients. These further sequence parameters can be regarded as components of a vector Q. The remaining gradients are required for selective layer excitation, and for location-coding. Their precise form can vary depending upon the type of sequence.

The dependency of the value $S^+(Φ, Q, P)$ of the transversal magnetization density averaged over the voxel directly after the RF-pulse as a function of the sequence parameter Φ is very complicated, its precise curve can be determined both by numerical simulations as well as by analytical calculations. If Q stands for the other sequence parameters α and TR and P stands for the relevant object parameters T1, T2, SD, then the function $S^+(Φ, Q, P)$ is defined in accordance with the following equation:

$$S^+(Φ, Q, P) = S^+(Φ, α, TR, T1, T2, SD) \qquad \text{Equation 5}$$
$$= \frac{1-E_1}{|D|} * \sin α * |1 - Λ^*| * SD,$$

where:

$$E_1 = e^{-TR/T1}$$

$$D := 1 - E_1 \cos α -$$
$$\frac{1}{2}(1 - \cos α)(1 + E_1)(Λ + Λ^*) + (E_1 - \cos α)|Λ|^2$$

-continued

Λ and the complex Λ* conjugated therewith are defined by the continuous fraction $$\Lambda = b_0 + \cfrac{a_1}{b_1 + \cfrac{a_2}{b_2 + \cdots}},$$

with $$a_1 := \left[\frac{\gamma_1}{\alpha_1} + \frac{\beta_1}{\gamma_1}\right] * E_2^2 z,$$

$$a_{n>1} := -\frac{\gamma_{n-1}}{\alpha_{n-1}} \left[\frac{\gamma_1}{\alpha_1} + \frac{\beta_1}{\gamma_1}\right] * E_2^2 z^{2n-1},$$

$$b_0 = := -\frac{\beta_1}{\gamma_1} * E_2^2 z,$$

$$b_{n>0} := 1 + \frac{\gamma_n}{\alpha_n} \frac{\beta_{n+1}}{\gamma_{n+1}} * E_2^2 z^{2n+1},$$

where $$E_2 = e^{-TR/T2},$$

$$z = e^{j\Phi} = \cos\Phi + j*\sin\Phi,$$

$$j = \sqrt{-1},$$

$$\alpha_n := 1 - z^n E_1 \cos\alpha,$$

$$\beta_n := \cos\alpha - z^n E_1,$$

$$\gamma_n := \frac{1}{2}(\alpha_n - \beta_n).$$

The symbol := denotes a definition, wherein that which is to be defined is positioned on the side of the colon.

As mentioned above, it can be assumed that the signal strength $S(\Phi, Q, P)$ follows the function $S^+(\Phi, Q, P)$ in a proportional manner. Its curve on the x-axis $\Phi$ is shown by way of example in FIG. 2 (for exemplary values of the parameter vectors Q and P), with a y-axis scaled to the spin density SD. The function commences at an absolute maximum where $\Phi=0$, and after the following initial decrease, further maxima occur which are more or less pronounced. The graph only shows the x-axis up to the value $\Phi=180°$ where a relatively high maximum occurs. From this point, the function continues in an inverse manner in order to be repeated periodically from the x-axis value $\Phi=360°$. The function $S(\Phi, Q, P_i)$ is thus already completely defined by the $\Phi$-values in the interval $0° \leq \Phi \leq 180°$ and the function values outside this interval are given by trivial symmetry operations.

Figure 2:
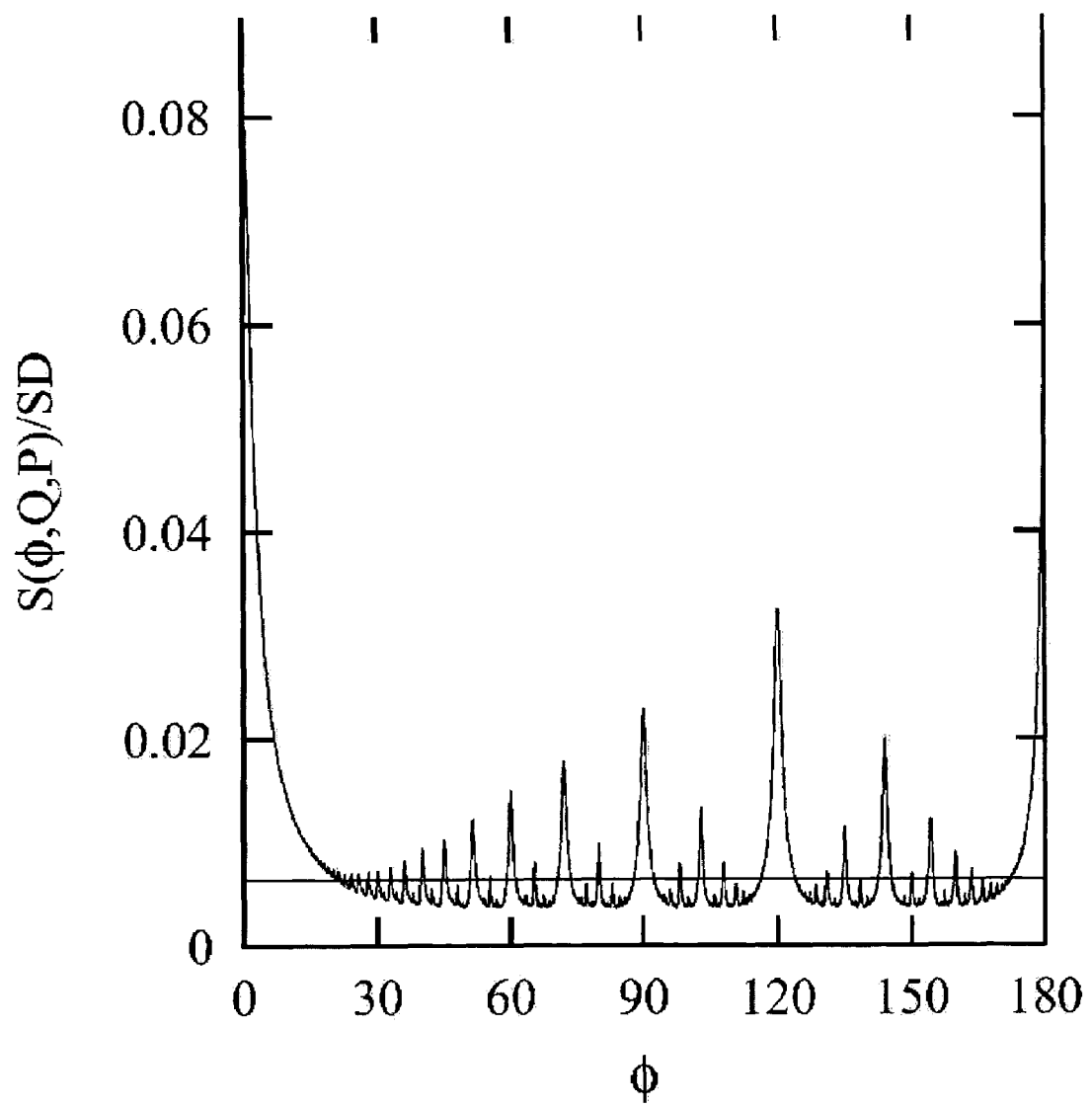
FIG. 2 shows the curve of the function S(Φ,Q,P)/SD for a specific value combination of the sequence parameters {Q} and the object parameters {P}={T1,T2}.

The horizontal line in FIG. 2 illustrates the "ideally spoiled" transversal magnetization which is no longer dependent upon T2:

$$S_{ideal}(Q, P) = \frac{1-E_1}{1-E_1*\cos\alpha} * \sin\alpha * SD \qquad \text{Equation 6}$$

This function is also produced with the above Equation 5 if T2/TR goes to zero, whereby $E_2$ goes to zero and consequently the continuous fraction Λ goes to zero.

For effective RF-spoiling in terms of achieving a pure T1 contrast, the prior art uses for $\Phi$ those values, in which the variable $S(\Phi, Q, P)$ corresponds with $S_{ideal}(Q, P)$ in close approximation and where possible independently of the other sequence and object parameters. FIG. 2 clearly demonstrates the fact already discussed above that in this case several ideal values of this type are possible for $\Phi$. As also already mentioned above, these ideal values do not depend appreciably upon the object parameters P.

The idea which forms the basis of the invention can now be illustrated by a specific case. For $\Phi=0$, a pure N-FFE-sequence would be obtained, i.e. a sequence with high signal strength and pronounced T2/T1 contrast. It has been found and can be demonstrated generally both by analysis and also by simulation that the positions of the maxima of the function do not depend upon object parameters but rather merely upon $\Phi$, whereas the transition from one maximum to a lower signal level (by reason of the RF-spoiling effect becoming stronger) occurs all the more quickly the greater primarily the T2 time. More specifically, the width of a maximum in leading order (i.e. with the exception of correction terms including also T1) is inversely proportional to T2. This is illustrated in FIG. 3.

Figure 3:
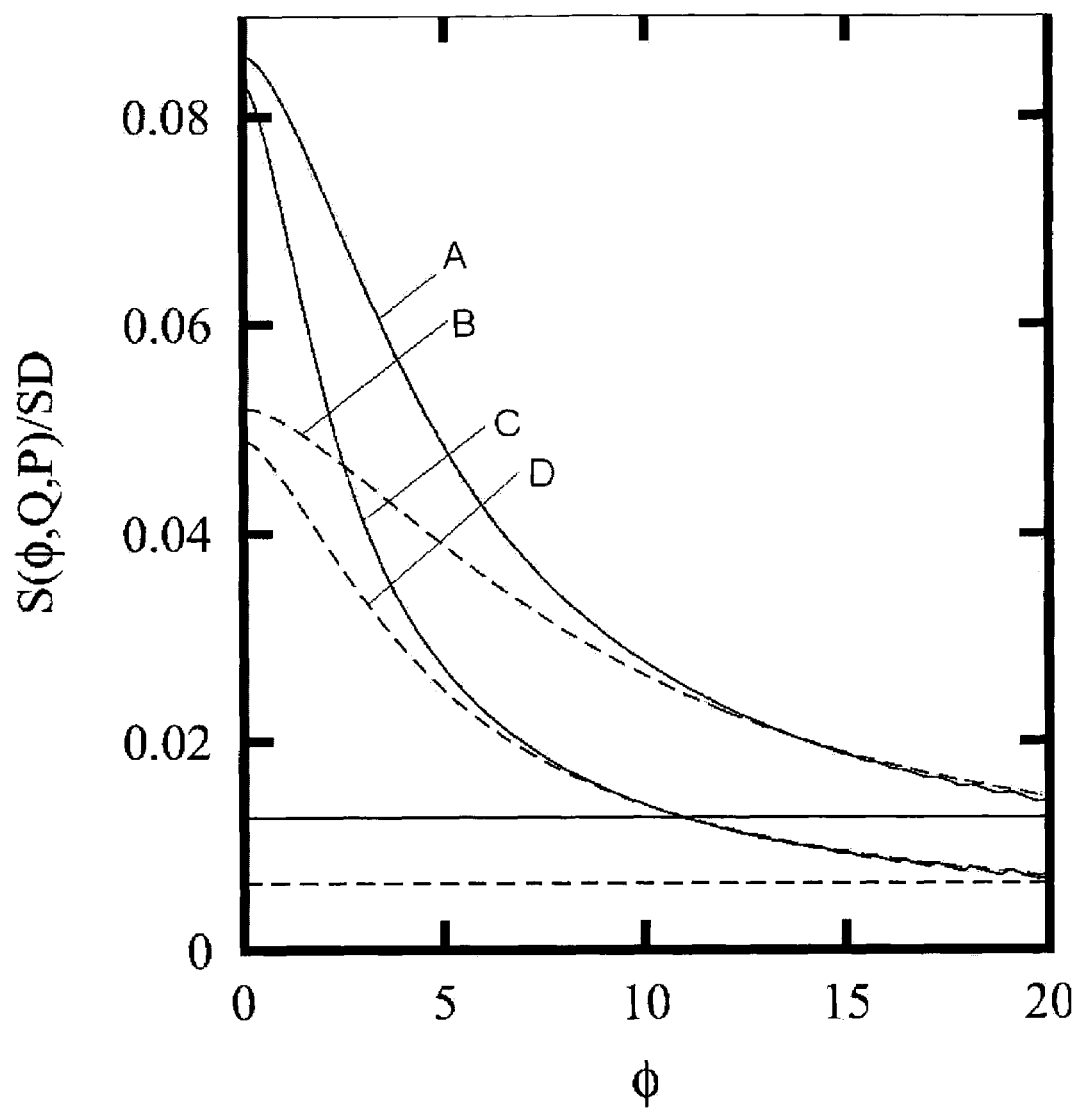
FIG. 3 shows the curves of the function S(Φ,Q,P_i)/SD for various value combinations of the parameters {P}={T1,T2) over a range of the initial decrease from Φ=0°.

FIG. 3 shows in a common graphical illustration the curve of the function $S(\Phi, Q, P)/SD$ for various value combinations of the object parameters T1 and T2. The Figure shows only the area of the x-axis in the region of the pronounced maximum with $\Phi=0$ at a flip angle $\alpha=50°$, a repetition time TR=3 ms and object parameters according to the following table:

TABLE 2

| Curve | T1 [ms] | T2 [ms] | T1/T2 |
|-------|---------|---------|-------|
| A | 500 | 50 | 10 |
| B | 500 | 25 | 20 |
| C | 1000 | 100 | 10 |
| D | 1000 | 50 | 20 |

It is clearly evident that the maximum depends mainly upon T1/T2 (and not upon TR) (as in the case of the N-FFE-sequence type), whereas the lower T1-FFE level is determined substantially by T1/TR (according to Equation 6, the values $S_{ideal}(Q, P)$ for idealized RF-spoiling are indicated as horizontal lines). The theoretical finding that the width of the maxima is in close approximation inversely proportional to T2 is revealed clearly by a comparison of the curves with respectively identical T1/T2. Similar results also apply to the remaining maxima ($\Phi=180°, 120°, \ldots$) but with increasingly smaller signal values.

In accordance with the invention, $\Phi$ is then adjusted to a value $\Phi_c$, at which the signal of the substance with the shorter T2 (e.g. curve A) has fallen to a less considerable extent (i.e. it still has a higher, signal-rich N-FFE portion) than the signal of the substance with the longer T2 (e.g. curve C). It is demonstrated that in many cases which are of practical relevance the contrast $$S_{AC} = S(\Phi_c, Q, P_A) - S(\Phi_c, Q, P_C) \qquad \text{Equation 7}$$

for this reason reaches a maximum level in a region lying between the $\Phi$-value for a maximum of the signal strength and the next closest $\Phi$-value for $S_{ideal}$, i.e. it does not correspond to either an N-FFE-sequence or to a T1-FFE-sequence. This method can be applied in the surrounding region of each maximum but also in the region of the initial decrease close to $\Phi=0$.

Since substances with shorter T2-times tend also to have shorter T1, the sequence thus adjusted then demonstrates characteristics of a T1-weighting, only now at a higher signal level than with a T1-FFE-sequence. The useful interaction of these effects will be discussed in more detail hereinunder in the description of advantageous applications.

From the observation above, it is possible to draw the following general conclusion: Assuming there is a wish to contrast a specific substance of the object volume to be imaged as a "target substance" with respect to one or several other selected substances in an image representation, then a possible approach consists of i) determining for each substance i the function $S(\Phi, Q, P_i)$ which for the values of the parameters $P_i$ characteristic of the relevant substance describes the signal strength in dependence upon $\Phi$, ii) finding and adjusting by means of comparative observation of the determined functions, a $\Phi$-value, in which the desired contrast reaches an optimal level.

According to this concept, various contrast criteria can be selected and fulfilled to an optimal extent, which clears the way for various advantageous applications and embodiments of the invention, as described below.

EMBODIMENTS AND APPLICATIONS

The prerequisite described above, namely that substances with shorter T2-times tend also to have shorter T1-times is fulfilled inter alia in biological tissues. Therefore, the method in accordance with the invention is of particular benefit in MR-imaging of biological objects without, however, being limited to this area of application.

In a preferred embodiment of the invention, $\Phi_c$ is selected in the region of the initial decrease because the strongest effects can be expected here. For correspondingly small $\Phi$-values and for the condition T1>>T2 (which is fulfilled for many biological tissues) the above Equation 5, which the function $S(\Phi, Q, P)$ follows proportionally, can be simplified by approximations and from this it is possible in turn to derive a simple empirical formula for the $\Phi$-value to be adjusted:

$$\Phi_c \approx f_\alpha \frac{TR}{T2_x}, \qquad \text{Equation 8}$$

where for a specified $T2_x$ the function S falls the sharpest at $\Phi=\Phi_c$, in relation to the maximum at $\Phi=0$. In order to contrast two substances A and B, $T2_x$ should therefore be selected between $T2_A$ and $T2_B$, preferably in the middle or approximately in the middle between these two values. The factor $f_\alpha$ depends merely upon the flip angle $\alpha$, according to a function which is defined by the following table of values:

TABLE 3

| | $\alpha[°]$ | | | | | | | | |
|---|---|---|---|---|---|---|---|---|---|
| | 10 | 20 | 30 | 40 | 50 | 60 | 70 | 80 | 90 |
| $f_\alpha$ | 3.0 | 8.8 | 15.7 | 23.0 | 30.4 | 37.4 | 44.2 | 50.4 | 56.2 |

In one advantageous application of the invention the aim is to suppress volume regions in an MR-image representation which are primarily filled up by a substance which has a long T2-time. Substances of this type in biological objects are e.g. free liquids (liquor) which have considerably longer T2-times (ca. 1000 ms) than the remaining naturally occurring soft part tissue (ca. 50 to 150 ms). The contrast enhancement described above can therefore be utilized to suppress free liquids. It is possible for this purpose to use for $\Phi_c$ the empirical formula according to Equation 8, wherein for $T2_x$ a value is specified which is well below the spin-spin relaxation time of the substance which is to be suppressed.

Figure 4:
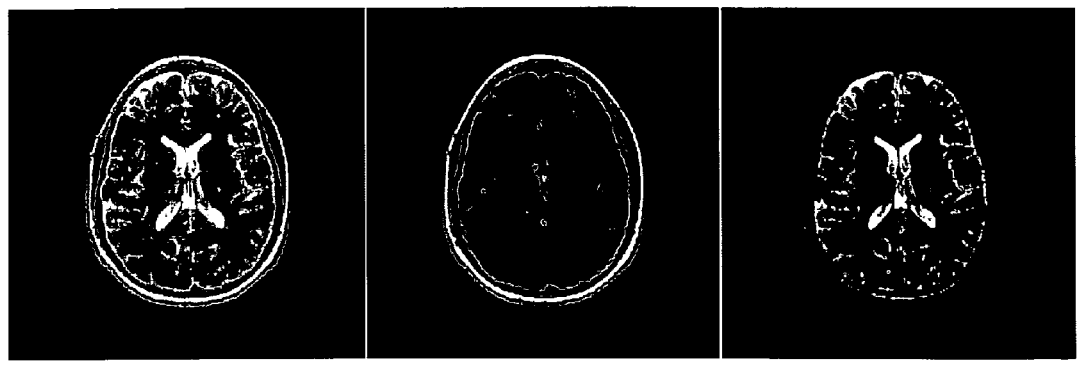
FIG. 4 shows image representations of a first example of an improvement in contrast in accordance with the invention.

FIG. 4 illustrates the liquor suppression which can be achieved by the invention by way of example with reference to an axial image of the cranium of a healthy subject. The image on the left-hand side in FIG. 4 shows the picture using a conventional N-FFE-sequence with TR=5.19 ms and $\alpha$=50°, wherein $\Phi$=0. In comparison therewith, the middle image in FIG. 4 shows the picture using a sequence in accordance with the invention, in which $\Phi=\Phi_c=1.5°$ has been selected (i.e. a value which is found to be "optimal" in the region of the initial decrease of the function $S(\Phi)$) with otherwise identical sequence parameters as in the case of the illustration on the left-hand side.

On the other hand, the invention can also be utilized in order to highlight substances with a long T2-time (e.g. the liquor) with respect to other substances. This is achieved e.g. by generating the difference image from a conventional N-FFE-image with $\Phi$=0 and an image in accordance with the invention with $\Phi=\Phi_c$. The image on the right-hand side in FIG. 4 shows this type of difference image as can be obtained from the left-hand and middle image and which illustrates substantially only the liquor.

A further useful application of the invention relates to MR-image representations of biological objects with contrast agent application. The venous application of paramagnetic contrast agents, such as e.g. Gd-DTPA and their subsequent absorption in the tissue serves to shorten the relaxation times T1 and T2 in comparison with their native values $T1_0$ and $T2_0$. The strength of this substantially linearly extending effect depends upon the local contrast agent concentration C:

$$1/T1 = r1 * C + 1/T1_0 \qquad \text{Equation 9}$$

$$1/T2 = r2 * C + 1/T2_0 \qquad \text{Equation 10}$$

The relaxivities r1 and r2 depend upon the type of contrast agents (CA) and the absorbing tissue. In most cases, r2 is only slightly greater than r1.

At the present time, the effect of T1 reduction is used predominantly in imaging. In this case, use is made of the fact that in T1-weighted photographs tissues with shorter T1-times are illustrated with a stronger signal than those tissues with long T1-times. In general, since the increased vascularisation of tumors causes them to absorb contrast agents both at augmented levels and more rapidly, they can thus be more effectively detected and characterized.

If the time recording window is physiologically limited, e.g. in abdominal imaging or by reason of a rapid CA-decrease (wash-out effect) or if the recording technique requires this e.g. for the dynamic illustration of the CA-absorption, in general rapid gradient echo sequences of the T1-FFE type are utilized. When the requirements upon the spatial resolution are particularly high, 3D-sequences are advantageous due to their improved layer resolution. Since 3D-sequences require very short repetition times (TR), the attainable time/spatial resolution is particularly limited in these T1-FFE variants.

The technique in accordance with the invention of a controlled adjustment of the $\Phi$-value can be utilized in an advantageous manner in this case. As the contrast agent concentration increases, the ratio of the relaxation times—T2/T1—approximates the inverse ratio of the relaxivities—r1/r2—which in general is only slightly less than one. Therefore, tissues which absorb contrast agents are also illustrated with a strong signal in T2/T1-weighted N-FFE-sequences, wherein the absolute value for small TR is actually considerably higher than the value which can be achieved with T1-FFE-sequences. However, since there are also tissues with high native (i.e. without CA) T2/T1-values (above all free liquids and fat), the attainable contrasts are often inadequate.

Figure 5:
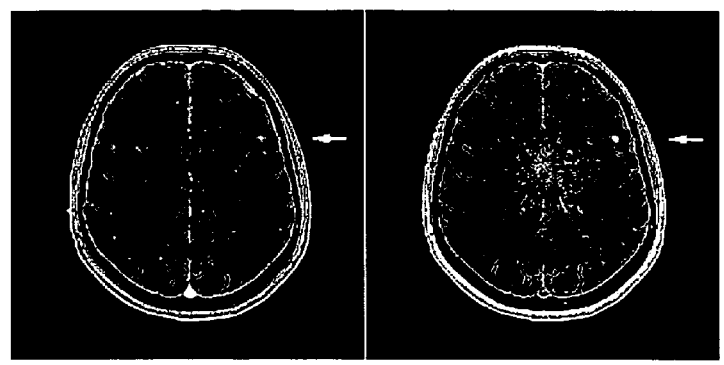
FIG. 5 shows image representations with contrast agents of a second example of an improvement in contrast in accordance with the invention.

As demonstrated above, liquids can already be suppressed by very small Φ-values. FIG. 5 illustrates the effect of contrast enhancement using the example of a focal lesion of a patient suffering from Multiple Sclerosis. The image on the left-hand side in FIG. 5 shows an axial image of the cranium using a conventional pure T1-FFE-sequence with Φ=50°. The image on the right-hand side in FIG. 5 shows the image using a sequence in accordance with the invention, in which Φ=Φ$_c$=3.4° was selected (i.e. a value which is found to be "optimal" in the region of the initial decrease in the function S(Φ)), with an identical repetition time TR like in the illustration on the left-hand side. In this case, the lesion can be delimited considerably more effectively. Although a hyperintense illustration of this lesion would have been obtained with an N-FFE sequence, this signal gain would not be delimited with respect to the liquor (see left-hand image in FIG. 4).

The application described above is also an illustrative example of a contrast criterion, according to which two conditions are to be fulfilled, namely firstly good contrast between CA-containing tissue and native tissue and secondly suppression of liquor. In accordance with the above Equation 3, this means that the signal difference $S_{n(CA)} - S_{n(nat)}$ between the CA-containing tissue and the native tissue is incorporated as a first element into the set $\{S_{ij}\}$ and that a second element of this set is the signal difference $S_{n(CA)} - S_{n(Liq)}$ between CA-containing tissue and liquor and that the criterion $K(\{S_{ij}\})$ of the optimization consists of making both the first and also the second signal difference as large as possible.

Figure 6:
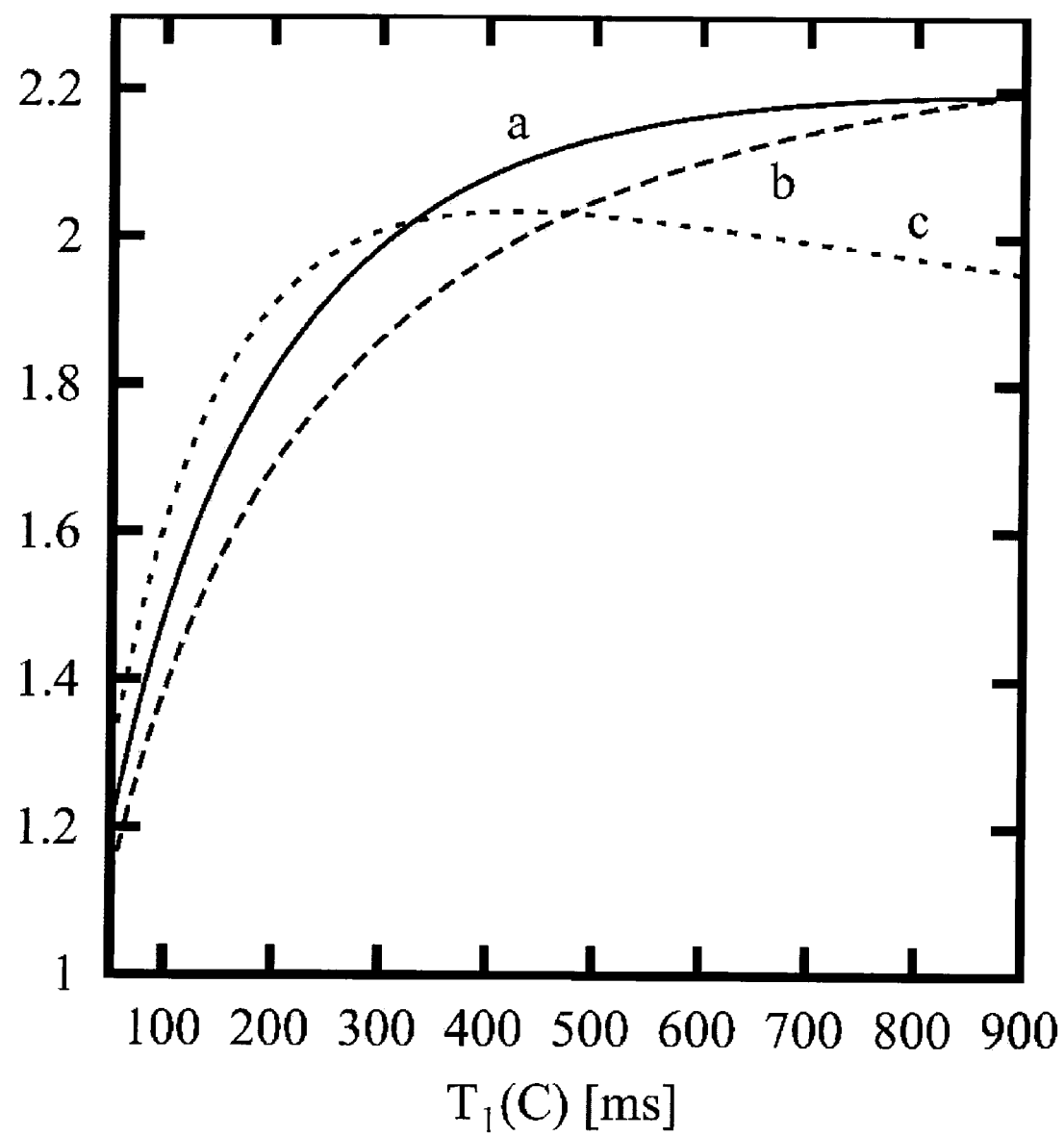
FIG. 6 shows the relative improvement in contrast between CA-containing tissue and native tissue as a function of the contrast agent-concentration, scaled by the corresponding T1-relaxation times.

FIG. 6 is a graph illustrating the improvement in contrast which can be achieved with the invention in comparison with a pure T1-FFE-sequence. The x-axis values indicate the T1-time of a CA-containing tissue which decreases as the CA-concentration increases. The y-axis represents the achieved contrast (signal difference) of the CA-containing tissue with respect to the native tissue (T1$_0$=1000 ms, T2$_0$=100 ms) scaled to the contrast which can be optimally achieved with a pure T1-FFE-sequence as compared to the native tissue. By using sequence parameters TR=3 ms and α=50°, three curves a, b, c have been recorded at different Φ-values. The curve a applies to a value Φ$_c$=0.9°, curve b applies to the selection Φ=0 (i.e. the pure N-FFE-sequence with the disadvantage of a strong liquid signal) and curve c applies to the selection Φ=1.8°. It is evident that the improvement in contrast is optimal in comparison with the pure T1-FFE-sequence in the case of curve a, it starts even with a marginal CA-concentration (long T1-times) and remains substantially constant for increasing concentrations (decreasing T1-times) over a relatively broad range. Therefore, Φ=0.9° must in this case be the value Φ$_c$ which in conjunction with the selected values of the other parameters is "optimal" in terms of the invention.

The gain in contrast thus achieved means that considerable improvements in terms of the attainable time/spatial resolution can be expected (cf. Equation 1).

As already indicated above, the invention is not limited to sequences, in which the crusher gradient is applied after the readout interval. An inventive selection of the Φ-value with the advantages of an increase in contrast can also occur in sequences, in which the read occurs in each case after a crusher gradient in each block. A sequence of this type is known e.g. by the acronym PSIF and is described in [2]. The signal has properties of a spin echo and is particularly suitable for highlighting substances which have long T2-times (liquids). PSIF-sequences have previously been utilized without RF-spoiling.

Furthermore, an inventive selection of the Φ-value can be made for increasing the contrast even in sequences in which the readout occurs in each case both prior to and after a crusher gradient in each block. This is a case with N=2, a sequence of this type is known e.g. by the acronym DESS and is described in [2]. By combining the FISP and PSIF signals, tissues which have long T2-times are illustrated in a particularly hyperintense manner. DESS-sequences were previously also only used without RF-spoiling and were utilized predominantly in orthopedic imaging.

Finally, there are also sequence variants, in which the echo time TE is greater than the repetition time TR. In the case of these so-called "shifted echo" sequences the readout intervals are surrounded on both sides by crusher gradients. In these sequences, the signal is equal to zero immediately before and after the RF-pulses. These sequences are used in particular in the functional and perfusion imaging of the brain, where sensitivity in relation to the parameter T2 is important. Previously, variants both with and without RF-spoiling were in use. Since the width dependency of the maxima is also present in these sequences, the parameter Φ can also have a contrast-enhancing effect in this case.

The invention can be put into practice by the suitable design of a control device for a magnetic resonance device, in that means are provided for controlling an imaging sequence according to the method in accordance with the invention. These means can be implemented completely or partially in a software package which can be loaded into the control computer of the magnetic resonance device. The software can contain the RF-phase control parameter Φ as one of the variables which can be adjusted individually by the operator. Alternatively, one or several different control programs each with a fixedly installed Φ-value can be provided which is dimensioned in the manner according to the invention, i.e. differently than conventional dimensioning leading to the "ideal" RF-spoiling. These control programs can be tailored with regard to the Φ-dimensioning to suit respective specific imaging objectives, e.g. "liquor suppression" or "contrast agent absorption", etc.

The invention claimed is:

1. Method of obtaining magnetic resonance measurement data for the reproduction of an image of a volume of an object which is subjected to a constant main magnetic field B$_0$ in a longitudinal direction, illustrating the contrast between volume elements (voxels) of the image representation which differ from one another in the parameter vectors P$_i$ of the magnetic resonance property of the respective inherent substance i, wherein the object volume which is to be imaged is subjected to a sequence of repetitive blocks of effects, each containing an RF-pulse with a flip angle α<90°, in order to generate a measurable transversal magnetization, and magnetic field gradients in order to obtain in each block N≧1 location-coded measurement signals of the transversal magnetization for the image reconstruction and to achieve sufficient intravoxel dephasing of the transversal magnetization before the appearance of the next RF-pulse, and wherein the phase φ(k) of the RF-pulse is changed from block to block in accordance with the rule $$\phi_k - \phi_{k-1} = \phi + k * \Phi,$$

where k is the running index of the blocks within the sequence and φ is a randomly selected phase angle, wherein for the sequence parameter Φ a value $\Phi_c$ is selected, in which the set $\{S_{ij}\}$ of the difference values $$S_{ij} = \sum_{n=1}^{N} [S_n(\Phi, Q, P_i) - S_n(\Phi, Q, P_j)] \quad \text{Equation 3}$$

is optimized in accordance with a selected criterion K ($\{S_{ij}\}$), where n with $1 \leq n \leq N$ is the running index of the measurement signal detected within a respective block, $S_n(\Phi,Q,P_i)$ or $S_n(\Phi,Q,P_j)$ is the value of the transversal magnetization of the voxels, which contain the substance i or j, in the condition of dynamic equilibrium at the point in time of the maximum of the nth measurement signal, Q stands for the values of the remaining sequence parameters, and $\{S_{ij}\}$ includes all desired pairs of substances i and j.

2. Method as claimed in claim 1, wherein for Φ a value $\Phi_c$ is selected, in which the difference $S_{ij}$ between the function $S_1(\Phi, Q, P_i)$ which applies to a first selected substance i and the function $S_1(\Phi, Q, P_j)$ which applies to a second selected substance j reaches a maximum.

3. Method as claimed in claim 1, wherein the selected value $\Phi_c$ is in the region of the initial decrease in the function $S_n((\Phi, Q, P_i)$, starting from a maximum at $\Phi=0°$.

4. Method as claimed in claim 2, wherein for $\Phi_c$ a value $$\Phi_c \approx f_\alpha \frac{TR}{T2_x}$$

is selected, where the factor $f_\alpha$ depends merely upon the flip angle α, according to a function which is defined by the following table of values:

| | α[°] | | | | | | | | |
|---|---|---|---|---|---|---|---|---|---|
| | 10 | 20 | 30 | 40 | 50 | 60 | 70 | 80 | 90 |
| $f_\alpha$ | 3.0 | 8.8 | 15.7 | 23.0 | 30.4 | 37.4 | 44.2 | 50.4 | 56.2 | and wherein TR is the repetition time of the blocks of the sequence and $T2_x$ is a time value which lies between the spin-spin relaxation time $T2_i$ of the substance i and the spin-spin relaxation time $T2_j$ of the substance j.

5. Method as claimed in claim 4, wherein $T2_x$ lies in the middle between or almost in the middle between $T2_i$ and $T2_j$.

6. Computer program product for implementing the method as claimed in claim 1.

7. Control device for a magnetic resonance device for obtaining magnetic resonance measurement data for the reproduction of an image of a volume of an object which is subjected to a constant main magnetic field $B_0$ in a longitudinal direction, illustrating the contrast between volume elements (voxels) of the image representation which differ from one another in the parameter vectors $P_i$ of the magnetic resonance property of the respective inherent substance i, wherein the control device comprises means for controlling a sequence of repetitive blocks of effects upon the object, each containing an RF-pulse with a flip angle α<90°, in order to generate a measurable transversal magnetization, and magnetic field gradients in order to obtain in each block $N \geq 1$ location-coded measurement signals of the transversal magnetization for the image reconstruction and to achieve sufficient intravoxel dephasing of the transversal magnetization before the appearance of the next RF-pulse, and wherein the phase φ(k) of the RF-pulse is changed from block to block in accordance with the rule $$\phi_k - \phi_{k-1} = \Phi + k*\Phi,$$

where k is the running index of the blocks within the sequence and φ is a randomly selected phase angle, characterized by means for adjusting the value of Φ to a value $\Phi_c$, in which the set $\{S_{ij}\}$ of the difference values $$S_{ij} = \sum_{n=1}^{N} [S_n(\Phi, Q, P_i) - S_n(\Phi, Q, P_j)]$$

is optimized in accordance with a selected criterion K ($\{S_{ij}\}$), where n with $1 \leq n \leq N$ is the running index of the measurement signals detected within a respective block, $S_n(\Phi,Q,P_i)$ or $S_n(\Phi,Q,P_j)$ is the value of the transversal magnetization of the voxels, which contain the substance i or j, in the condition of dynamic equilibrium at the point in time of the maximum of the nth measurement signal, Q stands for the values of the remaining sequence parameters, and $\{S_{ij}\}$ includes all desired pairs of substances i and j.

8. Control device as claimed in claim 7, wherein $\Phi_c$ is a value, in which the difference $S_{ij}$ between the function $S_1(\Phi, Q, P_i)$ which applies to a first selected substance i and the function $S_1(\Phi, Q, P_j)$ which applies to a second selected substance j reaches a maximum.

9. Control device as claimed in claim 7, wherein the value $\Phi_c$ is in the region of the initial decrease in the function $S_n(\Phi, Q, P_i)$, starting from a maximum at $\Phi=0°$.

10. Control device as claimed in claim 8, wherein $$\Phi_c \approx f_\alpha \frac{TR}{T2_x}$$

applies, where the factor $f_\alpha$ depends merely upon the flip angle α, according to a function which is defined by the following table of values:

| | α[°] | | | | | | | | |
|---|---|---|---|---|---|---|---|---|---|
| | 10 | 20 | 30 | 40 | 50 | 60 | 70 | 80 | 90 |
| $f_\alpha$ | 3.0 | 8.8 | 15.7 | 23.0 | 30.4 | 37.4 | 44.2 | 50.4 | 56.2 | and wherein TR is the repetition time of the blocks of the sequence and $T2_x$ is a time value which lies between the spin-spin relaxation time $T2_i$ of the substance i and the spin-spin-relaxation time $T2_j$ of the substance j.

11. Control device as claimed in claim 10, wherein $T2_x$ lies in the middle between or almost in the middle between $T2_i$ and $T2_j$.

* * * * *